US008759914B1

(12) United States Patent
Rawat et al.

(10) Patent No.: US 8,759,914 B1
(45) Date of Patent: Jun. 24, 2014

(54) DEEP SUB-MICRON INTERCONNECTION CIRCUITRY WITH SHIELDED LAYER STRUCTURE (71) Applicant: LSI Corporation, San Jose, CA (US)

(72) Inventors: Anil Singh Rawat, Bangalore (IN); Sumaant Kumar Thapliyal, Bangalore (IN); Deepak Doddamani, Bangalore (IN); Deepa V, Bangalore (IN)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/762,813

(22) Filed: Feb. 8, 2013

(51) Int. Cl.
H01L 23/52 (2006.01)
H01L 29/66 (2006.01)

(52) U.S. Cl.
USPC ............... 257/340; 257/208; 257/211

(58) Field of Classification Search
USPC .......................... 257/208, 211, 340
See application file for complete search history.

(56) References Cited

U.S. PATENT DOCUMENTS

| 6,339,235 | B1 * | 1/2002 | Takata .................. 257/208 |
| 6,980,462 | B1 * | 12/2005 | Ramesh et al. .......... 365/154 |
| 7,006,370 | B1 * | 2/2006 | Ramesh et al. .......... 365/63 |
| 8,332,794 | B2 | 12/2012 | Law et al. |
| 2002/0167849 | A1 * | 11/2002 | Ohbayashi et al. ...... 365/189.09 |
| 2006/0149930 | A1 * | 7/2006 | Murakami et al. ....... 712/218 |
| 2009/0267139 | A1 * | 10/2009 | Maejima .............. 257/326 |
| 2012/0187494 | A1 | 7/2012 | Huang et al. |
| 2012/0218820 | A1 * | 8/2012 | Maejima .............. 365/185.11 |

* cited by examiner

Primary Examiner — Thanh V Pham
(74) Attorney, Agent, or Firm — Suiter Swantz pc llo (57) ABSTRACT The invention provides integrated circuit designs that use of an M2 interconnect layer in place of local interconnect conductors for programming in OD area to enable efficient use of OD area for routing the M1 signals in the stack devices. The use of M2 in place of local interconnect conductors for programming also enables the introduction of shields between adjacent M2 programming lines to reduce the capacitive coupling impact. This improves the transistor density and circuit performance significantly. Although the invention is applicable to integrated circuit design in general, it is particularly well suited to 20 nm static random accessory memory (SRAM) chips to produce transistor density circuit performance advantages over prior 20 nm and 28 nm SRAM chip layouts.

21 Claims, 7 Drawing Sheets

| Type of Row Decoder | Layer Used for Interconnections | Metal Layer Used for PD Line | VIA Programming |
|---|---|---|---|
| 28nm Row Decoder | Metal 1 for <A> <B> and <C> Programming | Metal 2 | VIA1 |
| 20nm Conventional Row Decoder | M0OD2 for <A> <B> and <C> Programming | Metal 1 | VIA0 |
| 20nm New Approach Row Decoder | M2 for <A> <B> and <C> Programming | Metal 1 | VIA1 |

FIG. 9

| Type of Row Decoder | Width | % Improvement |
|---|---|---|
| 28nm Row Decoder | 6.91 UM | |
| 28nm Conventional Row Decoder | 5.30 UM | 23.30% |
| 28nm New Approach Row Decoder | 4.48 UM | 15.47%; 35.17% |

DEEP SUB-MICRON INTERCONNECTION CIRCUITRY WITH SHIELDED LAYER STRUCTURE

TECHNICAL FIELD

The present invention relates to computer integrated circuits and, more particularly, to integrated circuits such as SRAM memory chips that include interconnection circuitry located in the deep sub-micron diffusion (OD) areas.

BACKGROUND

There is a continuing drive to increase the transistor density and circuit performance of integrated circuits in order to further the trend toward increased computer storage and processing capacity with lower costs, size and weight requirements. Engineering has progressed beyond the micron range into the deep sub-micron range, currently into the 28 nm and 20 nm ranges. There is a continuing need for improved efficiency of integrated circuit designs at the sub-micron design range.

In sub-micron integrated circuit design, a contact layer may be used for diffusion (OD) and metal connections. For example, a chip foundry may provide an OD local interconnect layer to improve the source-drain contact resistance and to provide a larger contact area for easier routing. A layer of metal typically referred to as metal-0 ("metal zero" typically denoted as M0) may be formed above the OD layer, typically in the form of metal-0 oxide diffusions (typically denoted as M0OD). In addition, a metal-0 polysilicon layer (typically denoted as M0PO) may be provided above a polysilicon (PO) layer. An integrated circuit layout may include multiple OD layers (typically denoted OD1, OD2, etc.). As a result, there may be multiple metal oxide diffusion layers over multiple OD layers (typically denoted M0OD1, M0OD2, etc.). In addition, there may be multiple metal oxide diffusion layers (M0OD1, M0OD2) over a single OD layer, if desired. Similarly, there may be multiple metal oxide diffusion layers over multiple polysilicon layer regions (typically denoted M0PO1, M0PO2, etc.). Additional metal layers may also be provided (typically denoted as metal-1 or M1, metal-2 or M2 and so forth).

Cross-layer conductors through the transistor stack forming layer connections commonly referred as "vias" are used to provide communication interconnections to the layers of the stack. A conductor with a via connecting to a particular layer is typically referred as a via denoted with the number of that layer. For example, a via to a metal-0 layer is typically referred to as a via-zero (typically denoted as VIA0). A via to an M1 layer is typically denoted as VIA1, a via to an M2 layer is typically denoted as VIA2, etc. A conductor may have multiple vias to connect layers together. For example, a conductor with VIA0 and VIA1 may be used to connect an M1 layer to an M0 layer.

In a conventional sub-micron circuit design, an M0OD1 layer is typically used as an OD contact layer to mitigate strain effects in the source-drain regions of the transistors. A separate M0OD2 layer is typically used as a signal interconnect layer for gating the transistors. In this type of layout, a restriction is imposed on the location of the M0OD2 interconnect layer preventing it from being routed over the OD region (where the M0OD1 layer is located) to avoid signal interference. This forces the M0OD2 control signals to be routed outside of OD region, which leads to area loss, longer routings and associated limitations on transistor density and circuit performance.

There is, therefore, a continuing need for techniques for improving the transistor density and circuit performance of integrated circuits and, more specifically, for improved approaches to control signal routing in sub-micron integrated circuit designs.

SUMMARY

The needs described above are met by integrated circuit designs that use M2 layers in place of local interconnect conductors for programming in the OD area to enable efficient use of the OD area for routing the M1 signals in the stack devices. The use of M2 layers in place of local interconnect conductors for programming also enables the introduction of shields between the M2 programming lines to reduce the capacitive coupling impact. This improves the transistor density and circuit performance significantly.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE FIGURES

The numerous advantages of the invention may be better understood with reference to the accompanying figures in which.

DETAILED DESCRIPTION OF ILLUSTRATIVE EMBODIMENTS

The invention may be embodied in integrated circuit designs that use an M2 interconnect layer in place of local interconnect conductors for programming in the OD area to enable efficient use of the OD area for routing the M1 signals in the stack devices. The use of an M2 interconnect layer in place of local interconnect conductors for programming also enables the introduction of shields between adjacent M2 programming lines to reduce the capacitive coupling impact. This improves the transistor density and circuit performance significantly. Although the invention is applicable to integrated circuit design in general, it is particularly well suited to 20 nm static random accessory memory (SRAM) chips to produce transistor density circuit performance advantages over prior 20 nm and 28 nm SRAM chip layouts.

Figure 1:
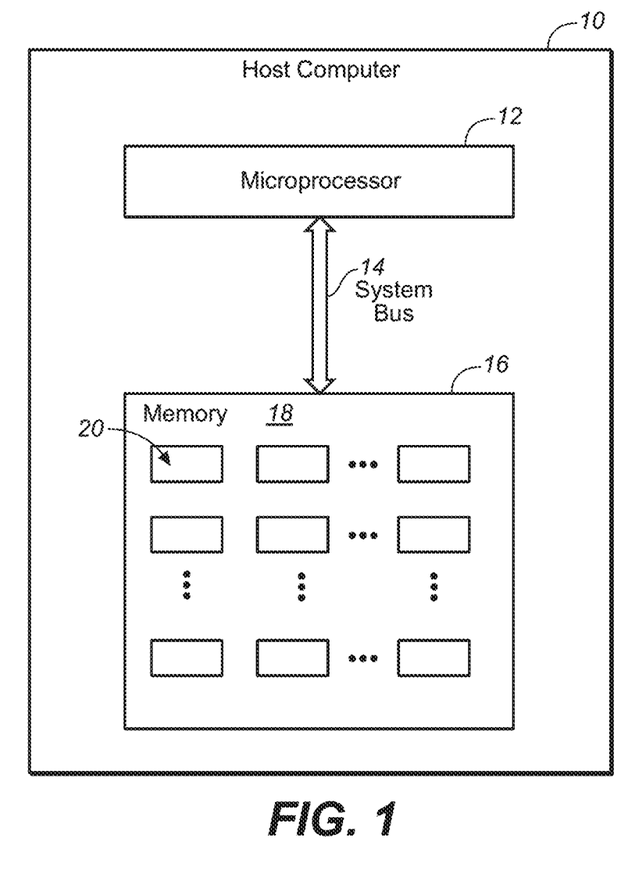
FIG. 1 is a block diagram of a computer utilizing a memory composed of integrated circuit chips constructed utilizing the present invention.

To provide an illustrative application of the invention, FIG. 1 is a block diagram of a computer 10 utilizing a microprocessor 12 and a memory 16 connected to the microprocessor 12 by a system bus 14. The memory 16 may be in the form of a memory card that fits into an interface connected to the system bus. The memory card typically includes an array of similar integrated circuit memory chips represented by the numbered chip 18 constructed utilizing the present invention. For example, each chip in this particular example may be a 20 nm SRAM integrated circuit chip. To provide one illustrative example, the chip 18 may be a 1K SRAM chip including 1024 individual transistors, represented by numbered transistor 20. A standard 500 Mb memory card, for example, may include 512 such chips. Of course, many other specific configurations may be created to utilize the invention on the desired scales for different configurations.

Figure 2:
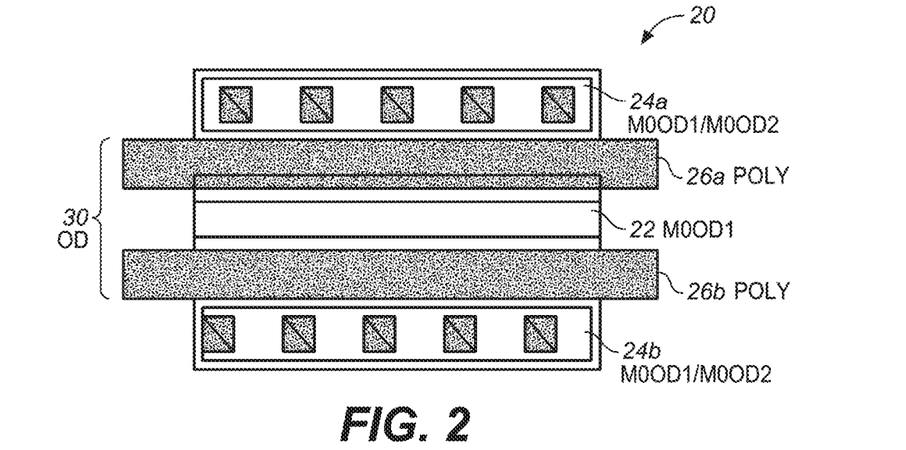
FIG. 2 is a conceptual block diagram of an integrated circuit transistor stack layout illustrating the location of interconnection circuitry in the OD area of the transistor stack.

FIG. 2 is a conceptual block diagram of an integrated circuit transistor stack 20 illustrating the OD area 30 of the transistor stack which is used for interconnection circuitry in the embodiments of the present invention. The OD area 30 includes a M0OD1 diffusion layer 22 providing a shared drain or source diffusion layer (OD layer) located between M0OD1/M0OD2 gate layers 24a-b, which are separated by poly layers 26a-b. The present invention utilizes the OD diffusion layer 30 underlying the M0OD1 diffusion layer 22 to route communication signals over an M2 layer, as well as providing ground conductors and shield layers providing isolation between the communication signals. This technique may be implemented in 20 nm technology, in which the additional M2 layer reflects greater resolution than prior 28 nm designs.

To place this approach in context, a preferred 20 nm technology utilizes a metal M2 layer to replace the local interconnect conductors and poly contacts utilized in certain prior 28 nm designs. In the earlier 28 nm technology, the contacts were formed by creating holes through the active areas prior to oxidation. This forces the M0OD2 layer to be located outside the OD area 30, which effectively eliminates at least three spaces provided by the OD area 30 per device for interconnection.

In the new technology, the connections are provided by an M2 layer overlying the common source or drain M0 interconnect layer in the OD region formed by the trench in the active area which improves strain engineering and provides larger, lower resistance contact areas. That is, the conductive layer approach requires placement of an M2 signal layer directly over the M0OD2 gating layer in the OD area 30. The improved circuitry thereby provides improvements in electromagnetic interference and current-resistance voltage drop (EM/IR) reliability.

Figure 3:
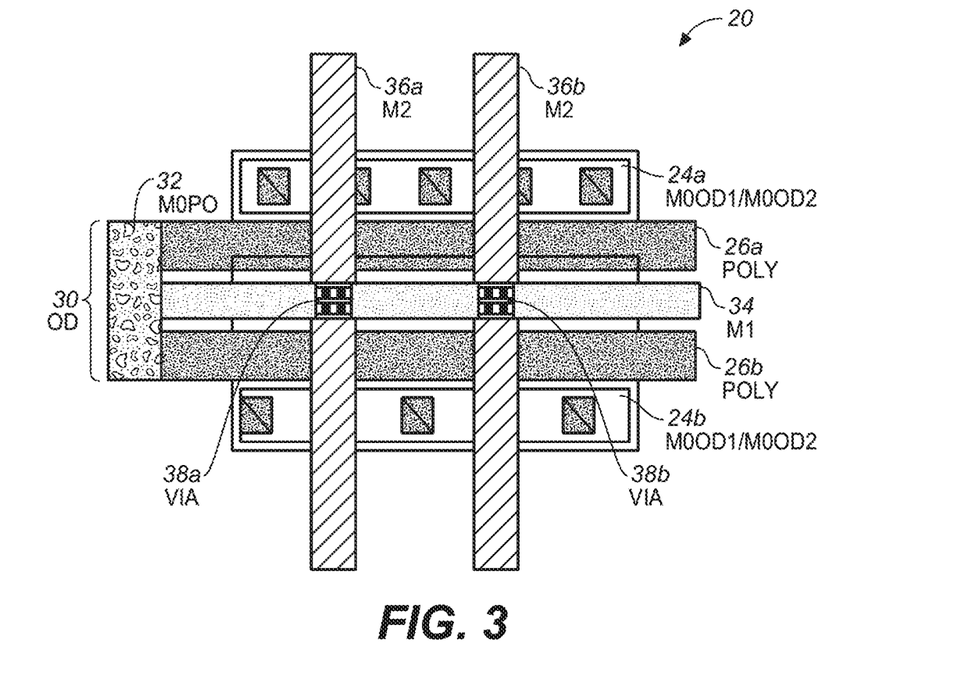
FIG. 3 is a conceptual block diagram of an integrated circuit transistor stack layout illustrating interconnection circuitry located in the OD area of the transistor stack.

FIG. 3 is a conceptual block diagram of the integrated circuit transistor stack 20 illustrating a first approach to providing interconnection circuitry in the OD area 30 of the transistor stack. FIG. 3 shows a cross-section of the layers of the stack, which run laterally (horizontal in the figure). Conductors providing signals or ground to the layers may run laterally or transverse (vertical in the figure) to the layers. In this example, an M0 poly interconnect region denoted as M0PO 32 is connected to the edges of the poly layers 26a-b. In addition, a metal-1 (M1) layer 34 runs laterally between the poly layers 26a-b with metal-2 (M2) conductors 36a-b running transverse to the stack. Vias 36a-b connect the M2 conductors 36a-b to the metal-1 layer 34 to provide communication signal routing to the metal-1 layer. Since the M1 layer cannot be placed directly over the M0OD2 gating layer, local interconnect conductors are utilized to route the communication signals from the M1 layer to the M0OD2 layer. Although this arrangement places some communication features in the OD region, additional improvements can be achieved by replacing the M1 layer and associated local interconnects with an M2 connection layer positioned directly over the M0OD2 gating layer (see FIG. 6). It should be understood that embodiments may include multiple M0OD2 gating layers and associated M2 signaling layers (see FIG. 7). This alternative is typically implemented at 28 nm, but may also be implemented at 20 nm or other resolutions, as desired.

Figure 4:
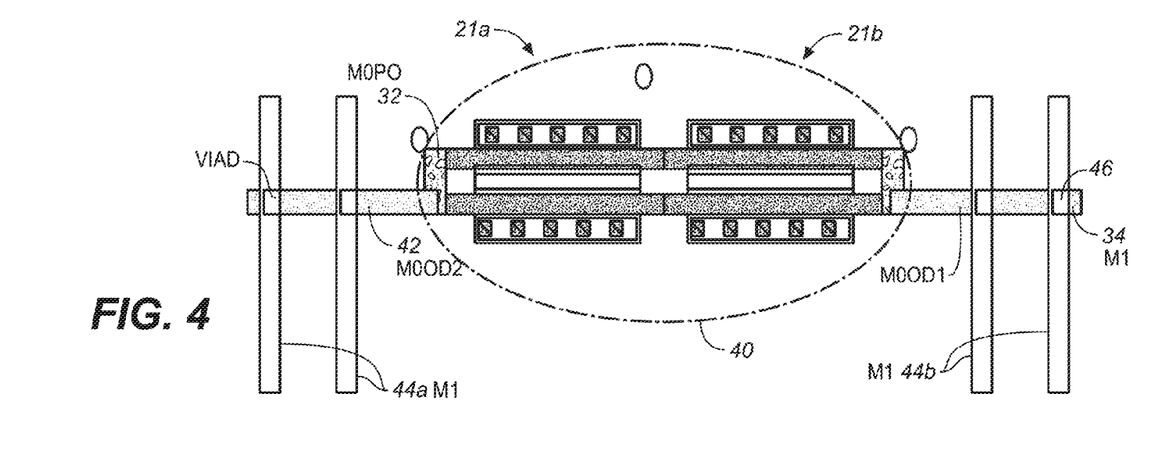
FIG. 4 is a conceptual block diagram of an integrated circuit transistor stack layout illustrating repeating transistor cells utilizing interconnection circuitry located in the OD area of the transistor stack.

FIG. 4 is a conceptual block diagram of an integrated circuit transistor stack 20 illustrating repeating transistor cells 21a-b within an area 40 (exploded in FIG. 5) utilizing the interconnection circuitry located in the OD area of the transistor stack. While only two repeating cells 21a-b are shown, the configuration extends horizontally and in a depth dimension (conceptually into the page) to the additional transistors of the integrated circuit. The poly interconnect layers M0PO 32 extend along the edges of the stack to connect the poly layers 26a-b. Although this particular example shows one illustrative M0OD2 layer 42 that also extends to the lateral edges of the stack 20, it will be understood that the device may include multiple M0OD2 layers with the illustrated layer 42 serving as an example. Transverse M1 conductors 44a-b are connected to the M0OD2 layer by vias represented by the numbered via 46.

Figure 5:
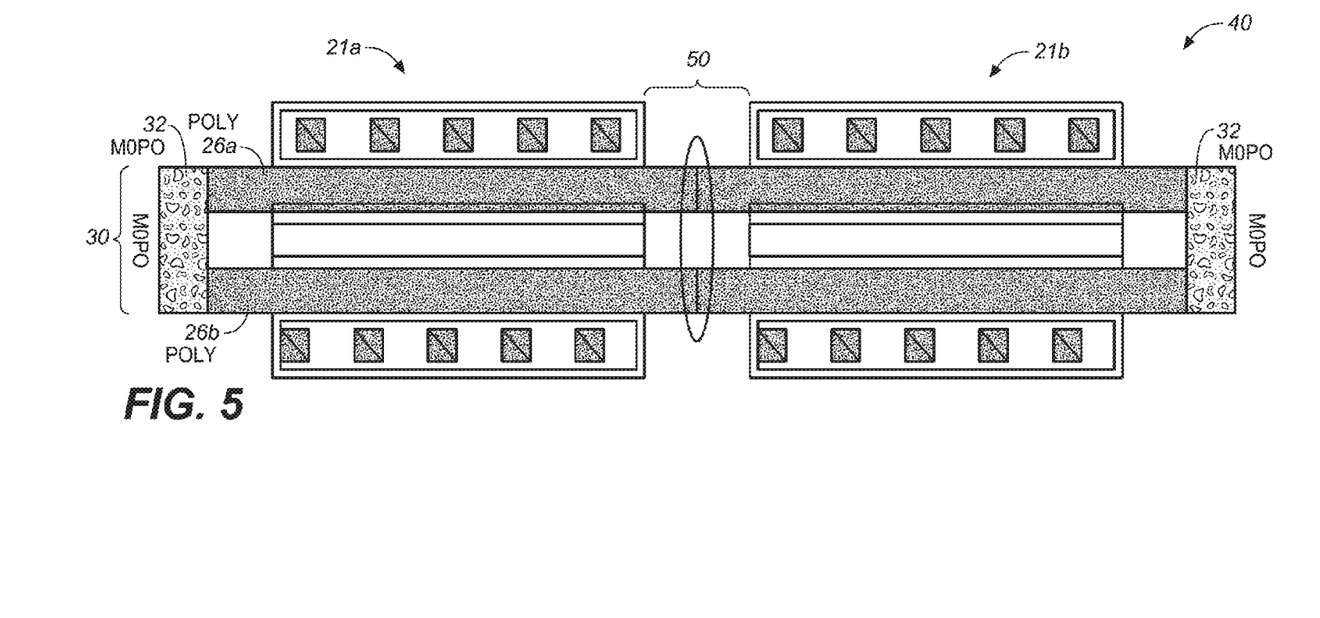
FIG. 5 is a conceptual block diagram of an expanded view of the repeating transistor cell layout in the OD area of the transistor stack.

FIG. 5 is an expanded view of the area 40 showing the repeating cell layout in the OD area of the transistor stack. While a lateral metal-2 (M2) layer is used to provide a signal layer to replace the local interconnects to the M0OD2 layers, the region 50 between the cells used for additional conductor routing. In particular, this region is used to route ground conductors to shield layers provided between the M0OD2 layers. This is shown in more detail in FIGS. 6 and 7.

Figure 6:
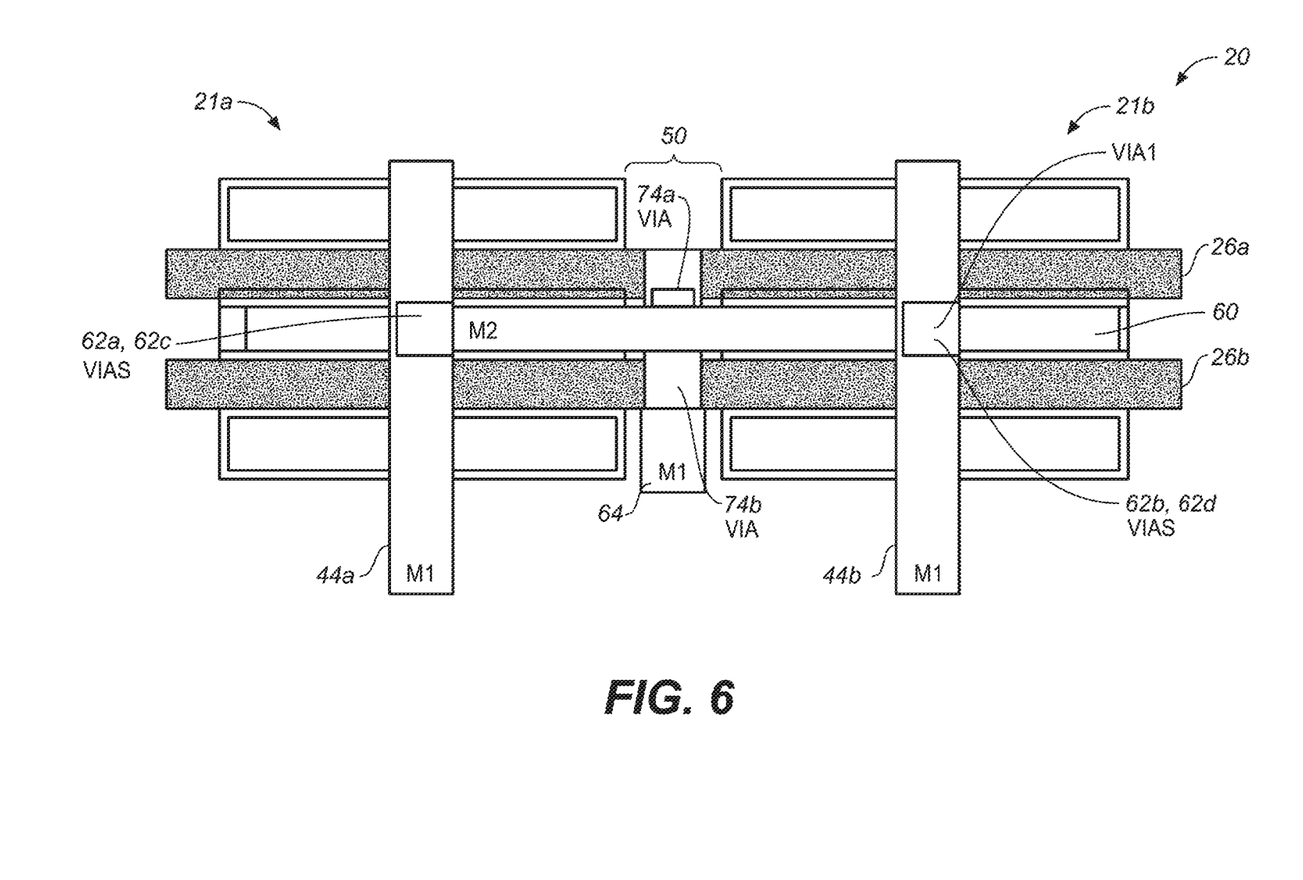
FIG. 6 is a conceptual block diagram of an integrated circuit transistor stack layout illustrating additional interconnection circuitry located in the OD area of the transistor stack.

FIG. 6 is a conceptual block diagram of an integrated circuit transistor stack that includes metal-2 (M2) layers 60 to provide signals to respective M0OD2 layers. While FIG. 6 shows a single M2 layer 60, it will be understood that a separate M2 layer (M2 layers 60a-d) overlies each M0OD2 layer (M0OD2 layers 42a-d) to provide programming signals to its respective M0OD2 layer. The signal vias 62a-d are provided to connect the M1 conductors 44a-b to the M2 layers 60a-d in place of local interconnect conductors for programming of the M0OD2 layers. The long M0OD2 runs cause capacitive coupling between the adjacent M0OD2 layers. The capacitive coupling is greatly enhanced by the presence of the conductive M2 signal layers used to replace the local interconnects as well as the dielectric poly layers between adjacent M0OD2 layers. It is therefore important to provide shielding between the M2 layers and their associated M0OD2 layers to abate signal interference that could result from the capacitive coupling.

In this regard, it should be appreciated that FIG. 6 is merely diagrammatic and not presented to scale. In the actual physical devices, the lateral dimension (horizontal in FIG. 6) may be larger than the transverse dimension (vertical in the FIG. 6)

because the wafers are very much wider than they are thick. That is, the relative thickness of layers (vertical dimension) may be exaggerated in conceptual diagrams for illustrative convenience. The M1 conductors 44a-b that extend transverse to the M0OD2 layers of the stack may therefore be much further apart from each other than the M2 layers (represented by the single M2 layer 60 shown in FIG. 6) that overlay the M0OD2 layers of the stack. The transverse layers M2 also have a larger second dimensional extent (i.e., in the dimension into the page) than the relatively slender transverse M1 conductors. This result in much higher capacitive coupling between the lateral M2 layers and their associated M0OD2 layers than between the transverse M1 conductors.

To reduce the coupling capacitance between adjacent M2 layers and their associated M0OD2 layers in this configuration, the signals X and Y are programmed such that the ground line is located be between the X and Y signaling lines, where a central grounded M1 conductor 64 is located. A set of shield layers 72a-b are positioned between adjacent M0OD2 layers and their respective overlaying M2 interconnect layers. A set of ground vias 74a-b on the central M1 conductor 64 provide grounding connections from the central M1 conductor 64 to the shield layers 72a-b. Locating the grounding M1 conductor 64 laterally between the M1 signal conductors 44a-b in the region 50 between adjacent transistor cells enables the introduction of the shielding shield layers 72a-b between the M0OD2 layers and their respective overlaying M2 interconnect layers to reduce the capacitive coupling impact. This is shown in greater detail in FIG. 7.

Figure 7:
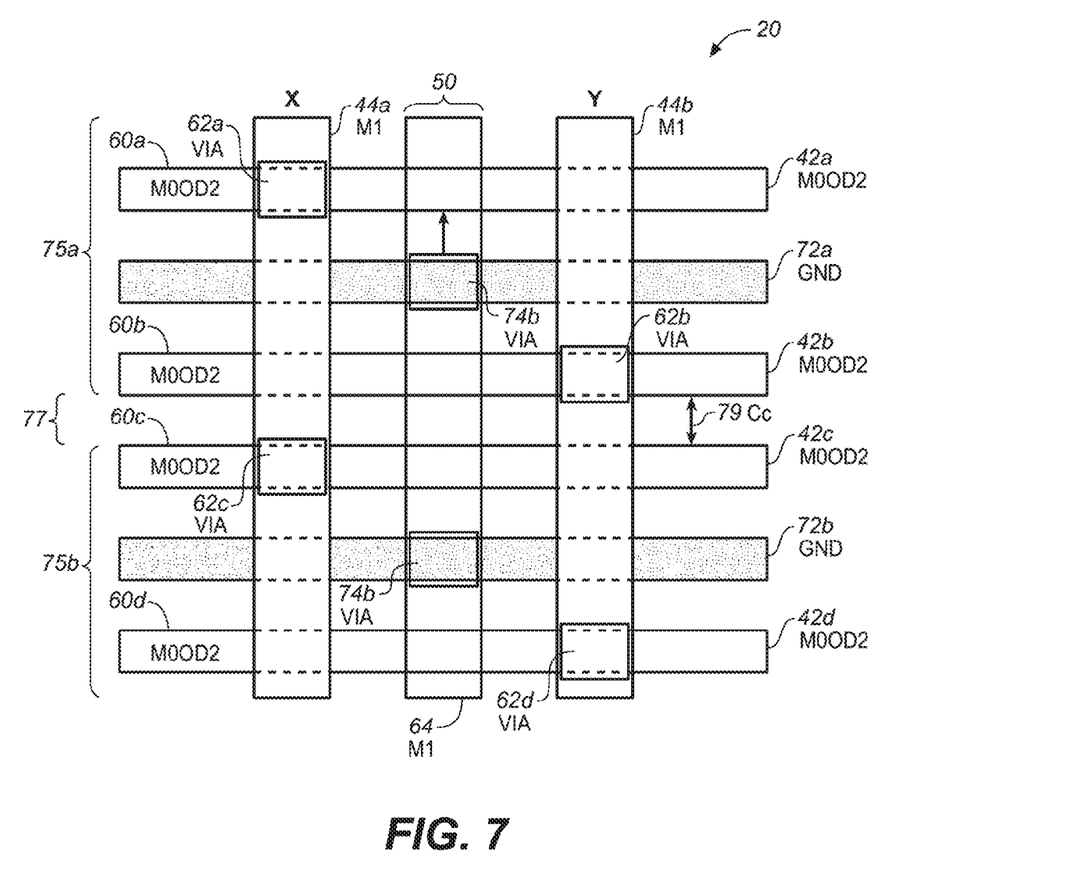
FIG. 7 is a conceptual block diagram of an integrated circuit transistor stack layout illustrating vias and shield layers in the transistor stack.

FIG. 7 is a conceptual block diagram of the layer interconnection within the stack, which includes four M0OD2 layers 42a-d as an illustrative example. Each M0OD2 layer 42a-d has a respective overlaying M2 signal interconnect layer 60a-d. That is, the M2 signal interconnect layer 60a overlies M0OD2 layer 42a, M2 signal interconnect layer 60b overlies M0OD2 layer 42b, M2 signal interconnect layer 60c overlies M0OD2 layer 42c; and M2 signal interconnect layer 60d overlies M0OD2 layer 42d. A set of signal vias 62a-d provide connections from the M1 conductors 44a-b to the M0OD2 layers 42a-d by way of their respective M2 layers 60a-d. Specifically, the "X" signal line on the M1 conductor 44a is provided to the M2 layer 60a through the signal via 62a. The "X" signal line on the M1 conductor 44a is also provided to the M2 layer 60c through the signal via 62c. The "Y" signal line on the M1 conductor 44b is provided to the M2 layer 60b through the signal via 62b. In addition, the "Y" signal lines on the M1 conductor 44b is also provided to the M2 layer 60d through the signal via 62d.

In this particular example, the inter-cell region 50 is used to provide ground conductor routing from the central M1 conductor 64 to the grounded shield layers 72a and 72b. Specifically, a first ground layer 72a extends between the M0OD2 layers 42a 42b. Similarly, a second ground layer 72b extends between the M0OD2 layers 42c and 42d. A set of ground vias 74a-b connect the central M1 conductor 64 to the grounded shield layers 72a and 72b. In particular, the ground via 74a connects the central M1 conductor 64 to the grounded shield layer 72a, and the ground via 74b connects the central M1 conductor 64 to the grounded shield layer 72b.

It should be noted that the first ground shield layer 72a eliminates capacitive coupling between the M0OD2 layers 42a and 42b within a first shielded layer structure 75a, while the second ground shield layer 72b eliminates capacitive coupling between the M0OD2 layers 42d and 42d within a second shielded layer structure 75b. Note further that there is no shield layer between the M0OD2 layers 42b and 42c, which is the location of the common source or drain OD region 77 (i.e., between the first shielded layer structures 75a and the second shielded layer structures 75b). Although the shield layers 74a and 74b do not completely eliminate the capacitive coupling (indicated with element 79) in the OD region 77 between the central M0OD2 layers 42b and 42c, the ground layers 74a-b together provide a sufficient reduction in the capacitive coupling between the central M0OD2 layers 42b and 42c for effective signal discrimination and circuit performance without having to place a metal ground layer directly over the common OD region 77 between these layers. No prior integrated circuit designs have utilized this approach including M2 layers in place of local interconnects for programming M0OD2 layers while introducing sufficient shielding between the M2 programming lines to reduce the capacitive coupling impact. This improves the transistor density and circuit performance significantly.

Figure 8:
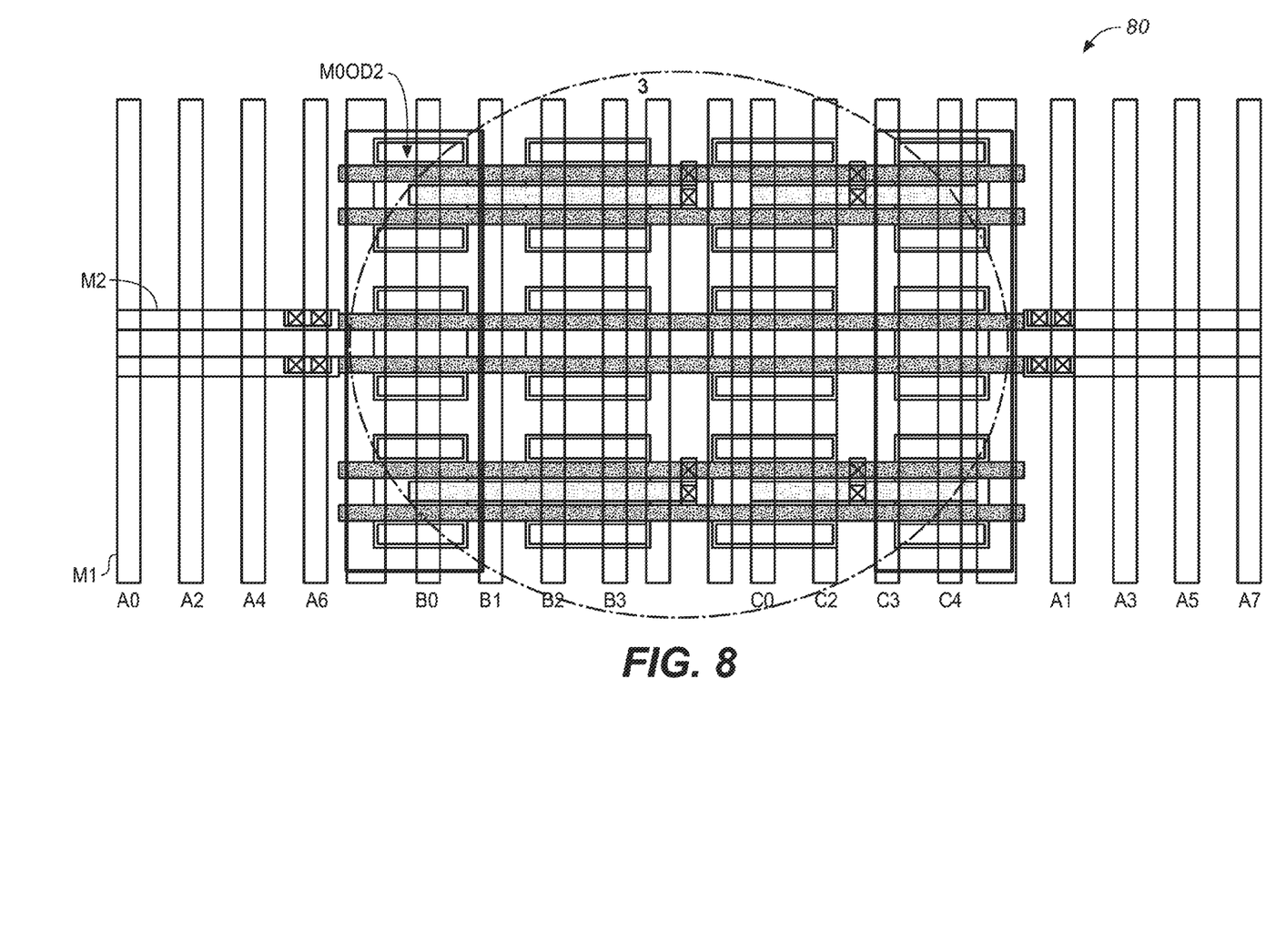
FIG. 8 is a conceptual block diagram of a decoder constructed utilizing interconnection circuitry located in the OD area of the transistor stack.

It will be understood that the circuitry techniques illustrated with reference to FIGS. 1-7 can be extended to encompass multiple memory transistors, chips, cards and so forth. Many different types of devices may therefore be constructed from integrated circuits constructed with this technology. To provide one illustrative example, FIG. 8 is a block diagram of a 20 nm decoder 80 constructed utilizing interconnection circuitry located in the OD area of the transistor stack.

In this particular example, the pre-decoding (PD) lines are run in the Metal-2 (M2) layers and the programming of PD lines for a row decoder are implemented using the VIA1 layer between Metal-1 (M1) and Metal-2 (M2) layers. M1 is used as local interconnect layer that can be easily routed over the OD region resulting in compact connection areas that allow the PD lines to be distributed evenly. This allows the gate contacts to be placed between the NMOS and PMOS devices, which is an efficient placement area.

Due to the introduction of the M2 interconnect layer, the PD lines are run in the M1 layers, which can be programmed to the NAND gate input using VIA0 layers. A restriction is encountered in that the new M2 interconnect layer for the M0OD2 layers cannot be routed over the OD region. Due to this restriction, the OD area cannot be used efficiently, which also slows down the decoding schemes not only by extra interconnect run length but also due to increased resistance of M1 layer (which is used for running the Pre-Decode lines).

Introducing the M0OD2 layer between the NMOS and PMOS devices to connect to their gates would increase the poly run length and thereby introduce extra interconnect delay. Alternatively, placing the gate connection at edges of either NMOS/PMOS devices would restrict all PD lines to that area only and again would increase the area number significantly.

The preferred approach shown in FIG. 8 provides a better solution. The pre-decoding PD lines (A, B and C) are located in Metal-1. These lines are connected to input of NAND gates. The interconnect layer for input to the pre-decoding line are provided in M0OD2. Since the OD area is not able to use for pre-decoding line routing, the PD lines and the long run length of poly are routed outside the OD region.

Without shielding, the run length increase of the M0OD2 layer used for the interconnect layer would have a high coupling capacitance. This is suppressed through the introduction of the grounded shield layers. In this approach, M2 is used as an interconnect layer with PD programming lines in M1. VIA1 is used for programming "A" address line and two programming address "B" and "C" lines are also provided in VIA1.

The advantages of this circuit design include the ability to use the OD area for PD lines, since the interconnection layers are now provided by M2 for interconnection between the PD line and the gate connections. This produces a significant area gain. In addition, the gate connections are provided between NMOS and PMOS, the poly run length is reduced which reduces the poly resistance, and the PD connections are located near the gates reducing the interconnect length.

Figure 9:
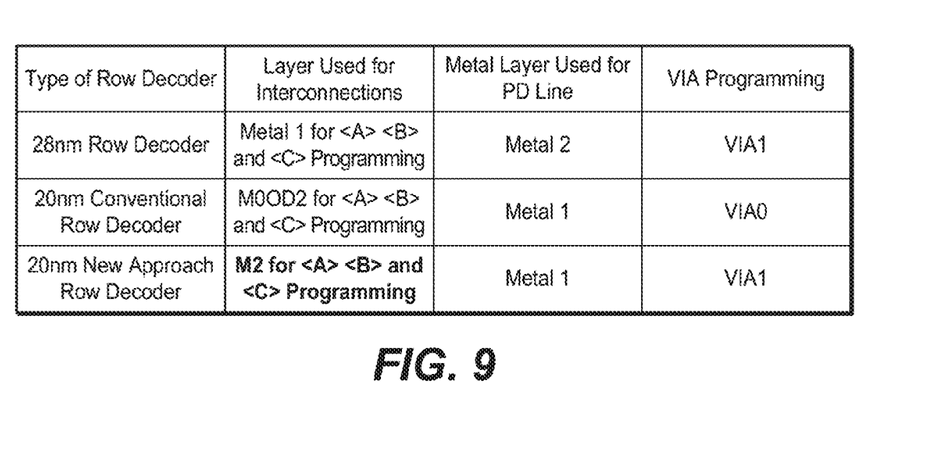
FIG. 9 is chart indicating layer and via utilization in the decoder constructed utilizing interconnection circuitry located in the OD area of the transistor stack.

The via routing for the diagram is summarized in the chart shown in FIG. 9. The first line indicates that in 28 nm decoder technology, M1 is used for layer conductor interconnections, while M2 is used for PD line programming and VIA1 is used for programming. The circuitry for this approach is shown FIG. 3. The second line of FIG. 9 indicates that in a 20 nm decoder technology, M0OD2 is used for layer conductor interconnections, while M1 is used for PD line programming and VIA0 is used for programming. The circuitry for this approach is shown FIG. 5. The third line of FIG. 9 represents the preferred 20 nm decoder technology, in which M2 is used for layer conductor interconnections, while M1 is used for PD line programming and VIA1 is used for programming. The circuitry for this approach is shown FIGS. 6 and 7.

Figure 10:
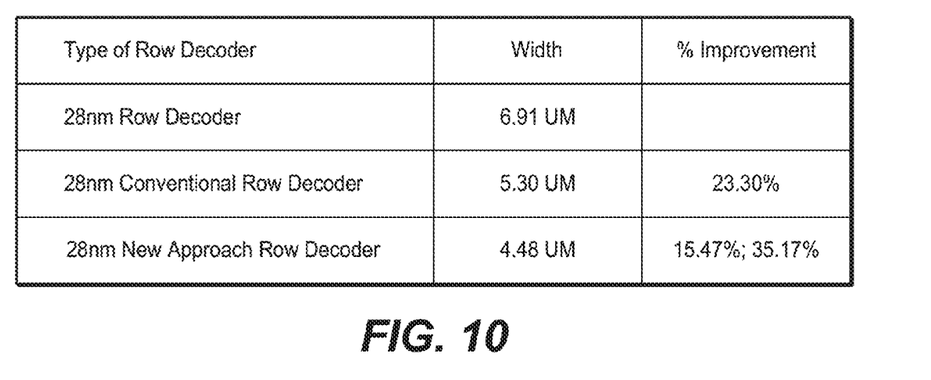
FIG. 10 is chart indicating the relative sizes of example decoders constructed utilizing interconnection circuitry located in the OD area of the transistor stack.

FIG. 10 is a chart providing size comparisons for integrated circuits constructed using the techniques of the present invention. The rows of the chart show in FIG. 10 correspond to the lines of the chart show in FIG. 9. The first line of FIG. 10 therefore represents the 28 nm alternative, which produces a base case transistor cell width of 6.91 um. The second line of FIG. 10 represents the first 20 nm alternative with a transistor cell width of 5.30 um, representing a reduction of 23.30% over the 28 nm base case. The third line of FIG. 10 represents the preferred 20 nm alternative with a transistor cell width of 4.48 um, representing a reduction of 15.47% over the first 20 nm alternative and 35.17% over the 28 nm base case.

The present invention may consist (but not required to consist) of adapting or reconfiguring presently existing systems. Alternatively, original equipment may be provided embodying the invention.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

It is further contemplated that each of the embodiments of the method described above may include any other step(s) of any other method(s) described herein. In addition, each of the embodiments of the method described above may be performed by any of the systems described herein.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that any optical aspects of implementations will typically employ optically-oriented hardware, software, and or firmware.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

Furthermore, it is to be understood that the invention is defined by the appended claims.

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. An integrated circuit comprising a stack of transistor layers [20], the integrated circuit further comprising:
   a shielded layer structure [75a] comprising a grounded shield layer [72a] operative to mitigate capacitive coupling between signal layers [62a-b] of the shielded layer structure; and
   a ground conductor [64] connected to the grounded shield layer [72a] a first signal programming line [44a] and a second signal programming line [44b] connected to the signal layers [62a-d]; and
   wherein the ground conductor [64] is located between the first signal programming line [44a] and the second signal programming line [44b].

2. The integrated circuit of claim 1, wherein:
   the stack of transistor layers [20] further comprises a transistor cell structure comprising a first transistor cell [21a] laterally spaced apart from a second transistor cell [21b]; and
   the ground conductor [64] is located in an inter-cell region [50] located laterally between the first and second transistor cells [21a-b].

3. The integrated circuit of claim 1, further comprising a plurality of similar transistor cell structures forming a memory array.

4. The integrated circuit of claim 1, further comprising a plurality of similar transistor cell structures forming a memory decoder.

5. An integrated circuit comprising a stack of transistor layers [20], the integrated circuit further comprising:
   a plurality of metal-zero diffusion (M0OD2) layers [42a, 42b] extending laterally forming gating layers in a stack of transistor layers [20];
   a first metal (M1) conductor layer extending transverse to the stack comprising a pair of signal conductors [44a, 44b] and a ground conductor [64] located laterally between the signal conductors;
   a second metal (M2) layer extending laterally within the stack comprising a plurality of signal layers [60a, 60b], each signal layer overlying a respective M0OD2 layer [42a, 42b] and providing a signal interface with its respective M0OD2 layer;
   a set of signal vias [62a, 62b] connecting the M1 signal conductors [44a, 42b] to the M2 signal layers [60a, 62b];
   the M2 layer further comprising a grounded shield layer [72a] extending laterally within the stack;
   a ground via [74a] connecting the M1 ground conductor [64] to the shield layer [72a];
   wherein the shield layer [72a] is located between the adjacent M2 signal layers [60a, 60b] to eliminate capacitive coupling between the adjacent M2 signal layers.

6. The integrated circuit of claim 5, wherein:
   the M1 signal conductors [44a, 42b] further comprise a first signal programming line and a second signal programming line; and
   the M1 ground conductor [64] is located laterally between the first signal programming line [44a] and the second signal programming line [44b].

7. The integrated circuit of claim 6, wherein:
   the stack of transistor layers [20] further comprises a transistor cell structure comprising a first transistor cell [21a] laterally spaced apart from a second transistor cell [21b]; and
   the M1 ground conductor [64] is located in an inter-cell region [50] located laterally between the first and second transistor cells [21a-b].

8. The integrated circuit of claim 7, further comprising a plurality of similar transistor cell structures forming a memory array.

9. The integrated circuit of claim 8, further comprising a plurality of similar transistor cell structures forming a memory decoder.

10. An integrated circuit comprising a stack of transistor layers [20], the integrated circuit further comprising:
    a first shielded layer structure [75a] comprising a first grounded shield layer [72a] operative to mitigate capacitive coupling between signal layers [62a-b] of the first shielded layer structure;
    a second shielded layer structure [75b] comprising a second grounded shield layer [72b] operative to mitigate capacitive coupling between signal layers [62c-d] of the second shielded layer structure;
    a ground conductor [64] connected to the grounded shield layer [72a]; and
    a common source or drain diffusion area [77] located between the first and second shielded layer structures [75a, 75b].

11. The integrated circuit of claim 10, wherein the first and second grounded shield layers [72a, 72b] are operative to mitigate capacitive coupling between the first and second shielded layer structures [75a, 75b].

12. The integrated circuit of claim 10, further comprising:
    a first signal programming line [44a] and a second signal programming line [44b] connected to the signal layers [62a-d]; and
    wherein the ground conductor [64] is located laterally between the first signal programming line [44a] and the second signal programming line [44b].

13. The integrated circuit of claim 10, wherein:
    the stack of transistor layers [20] further comprises a transistor cell structure comprising a first transistor cell [21a] laterally spaced apart from a second transistor cell [21b]; and
    the ground conductor [64] is located in an inter-cell region [50] located laterally between the first and second transistor cells [21a-b].

14. The integrated circuit of claim 10, further comprising a plurality of similar transistor cell structures forming a memory array.

15. The integrated circuit of claim 10, further comprising a plurality of similar transistor cell structures forming a memory decoder.

16. An integrated circuit comprising a stack of transistor layers [20], the integrated circuit further comprising:
    a first shielded layer structure [75a] comprising:
    a first plurality of metal-zero diffusion (M0OD2) layers [42a, 42b] extending laterally forming gating layers in a stack of transistor layers [20], a first metal (M1) conductor layer extending transverse to the stack comprising a pair of signal conductors [44a, 44b] and a ground conductor [64] located laterally between the signal conductors, a second metal (M2) layer extending laterally within the stack comprising a plurality of signal layers [60a, 60b], each signal layer overlying a respective one of the first plurality of M0OD2 layers [42a, 42b] and providing a signal interface with its respective M0OD2 layer,     a first set of signal vias [62a, 62b] connecting the M1 signal conductors [44a, 42b] to the M2 signal layers [60a, 62b] overlying the first plurality of metal-zero diffusion (M0OD2) layers [42a, 42b],     the M2 layer further comprising a first grounded shield layer [72a] extending laterally within the stack,     a first ground via [74a] connecting the M1 ground conductor [64] to the first shield layer [72a],     wherein the first shield layer [72a] is located between the adjacent M2 signal layers [60a, 60b] of the first plurality of metal-zero diffusion (M0OD2) layers [42a, 42b] to eliminate capacitive coupling between these adjacent M2 signal layers; and a second shielded layer structure [75b] spaced apart from the first shielded layer structure in the transverse direction, comprising:

a second plurality of metal-zero diffusion (M0OD2) layers [42c, 42d] extending laterally forming gating layers in a stack of transistor layers [20],     the first metal (M1) conductor layer extending transverse to the second plurality metal-zero diffusion (M0OD2) layers,     the second metal (M2) layer further comprising signal layers [60c, 60d], each overlying a respective layer of the second plurality of metal-zero diffusion (M0OD2) layers [42c, 42d] and providing a signal interface with its respective M0OD2 layer,     a second set of signal vias [62c, 62d] connecting the M1 signal conductors [44a, 42b] to the M2 signal layers [60c, 62d] overlying the second plurality of metal-zero diffusion (M0OD2) layers [42c, 42d],     the M2 layer further comprising a second grounded shield layer [72b] extending laterally within the stack,     a second ground via [74b] connecting the M1 ground conductor [64] to the second shield layer [72b],     wherein the second shield layer [72b] is located between the adjacent M2 signal layers [60c, 60d] of the second plurality of metal-zero diffusion (M0OD2) layers [42c, 42d] to eliminate capacitive coupling between these adjacent M2 signal layers;

a common source or drain diffusion area [77] located between the first and second shielded layer structures [75a, 75b].

17. The integrated circuit of claim 16, wherein:
the M2 layer does not include a connection layer overlying the common source or drain diffusion area [77]; and
the first and second grounded shield layers [72a, 72b] are operative to mitigate capacitive coupling between the first and second shielded layer structures [75a, 75b].

18. The integrated circuit of claim 17, wherein:
the M1 signal conductors [44a, 42b] further comprise a first signal programming line and a second signal programming line; and
the M1 ground conductor [64] is located laterally between the first signal programming line [44a] and the second signal programming line [44b].

19. The integrated circuit of claim 18, wherein:
the stack of transistor layers [20] further comprises a transistor cell structure comprising a first transistor cell [21a] laterally spaced apart from a second transistor cell [21b]; and
the M1 ground conductor [64] is located in an inter-cell region [50] located laterally between the first and second transistor cells [21a-b].

20. The integrated circuit of claim 19, further comprising a plurality of similar transistor cell structures forming a memory array.

21. The integrated circuit of claim 20, further comprising a plurality of similar transistor cell structures forming a memory decoder.

* * * * *